United States Patent
Chatterjee et al.

(10) Patent No.: US 7,595,649 B2
(45) Date of Patent: Sep. 29, 2009

(54) METHOD TO ACCURATELY ESTIMATE THE SOURCE AND DRAIN RESISTANCE OF A MOSFET

(75) Inventors: Tathagata Chatterjee, Allen, TX (US); Joe R. Trogolo, Plano, TX (US); Kaiyuan Chen, Dallas, TX (US); Henry Litzmann Edwards, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 204 days.

(21) Appl. No.: 11/860,993

(22) Filed: Sep. 25, 2007

(65) Prior Publication Data
US 2009/0079446 A1    Mar. 26, 2009

(51) Int. Cl.
*G01R 31/26* (2006.01)
(52) U.S. Cl. .......................... 324/719; 324/769; 438/17
(58) Field of Classification Search ................. 324/719, 324/765, 769; 438/14, 17
See application file for complete search history.

(56) References Cited

U.S. PATENT DOCUMENTS

| | | | | |
|---|---|---|---|---|
| 6,407,573 | B1 * | 6/2002 | Yamaguchi et al. | 324/719 |
| 6,649,430 | B2 * | 11/2003 | Yamaguchi | 438/17 |
| 7,388,387 | B2 * | 6/2008 | Bordelon, Jr. | 324/713 |

\* cited by examiner

*Primary Examiner*—Timothy J Dole
(74) *Attorney, Agent, or Firm*—Wade J. Brady, III; Frederick J. Telecky, Jr.

(57) ABSTRACT

Measurements of parameters of MOS transistors, also known as MOSFETs, such as threshold potentials, require accurate estimates of source and drain series resistance. In cases where connections to the MOSFET include significant external series resistance, as occurs in probing transistors that are partially fabricated or deprocessed, accurate estimates of external resistances are also required. This invention comprises a method for estimating series resistances of MOSFETs, including resistances associated with connections to the MOSFET, such as probe contacts. This method is applicable to any MOSFET which can be accessed on source, drain, gate and substrate terminals, and does not require other test structures or special connections, such as Kelvin connections.

13 Claims, 4 Drawing Sheets

US 7,595,649 B2

METHOD TO ACCURATELY ESTIMATE THE SOURCE AND DRAIN RESISTANCE OF A MOSFET

FIELD OF THE INVENTION

This invention relates to the field of integrated circuits. More particularly, this invention relates to methods of measuring MOS transistors.

BACKGROUND OF THE INVENTION

Metal oxide semiconductor (MOS) transistors, also known as MOSFETs, have several sources of series electrical resistance, including resistance of metal interconnects to source and drain regions, and resistance of source and drain regions. Accurate measurement of series resistance is important for assessing integrated circuit performance. The voltage—current relationship of MOS transistors is not linear, making extraction of the series resistance problematic. The current art addresses this problem by utilizing multiple transistor test structures, varying parameters such as channel length and width, to improve the accuracy of estimates of series resistance. This is disadvantageous due to increased cost and complexity of transistor testing.

Also, there exists an important need to measure series resistance of MOS transistors in production environments, under constraints of minimization of test time, minimization of test structures, and maximum utilization of test connections. Challenges of production testing of MOS transistor series resistance are increased by a need to perform measurements on wafers using probing equipment, which makes electrical contacts to devices being measured with metal probes. Contact resistances of probe tips to devices being tested are often a significant fraction of total series resistances of transistors, and are frequently variable and unrepeatable from probe contact to probe contact. The current art utilizes Kelvin connections (separate probes for current and voltage for each circuit node tested) to reduce contributions of probe contact resistance to uncertainty in estimates of transistor series resistance. This is disadvantageous due to increased test structure complexity and inefficient use of test connections.

Another need for measuring series resistance of MOS transistors occurs when integrated circuits are electrically analyzed, often after some disassembly or deprocessing. In this situation, transistors which are components of integrated circuits are measured in situ, without benefit of Kelvin connections or multiple test structures. Moreover, the feature sizes of transistors in state of the art integrated circuits are often below one micrometer, which exacerbates the problems of probe contact variability and repeatability.

SUMMARY OF THE INVENTION

This summary is provided to comply with 37 C.F.R. §1.73, requiring a summary of the invention briefly indicating the nature and substance of the invention. It is submitting with the understanding that it will not be used to interpret or limit the scope or meaning of the claims.

This invention comprises a method to estimate series resistance of source and drain terminals of a MOSFET, including resistances of electrical connections to the MOSFET.

DETAILED DESCRIPTION

Figure 1:
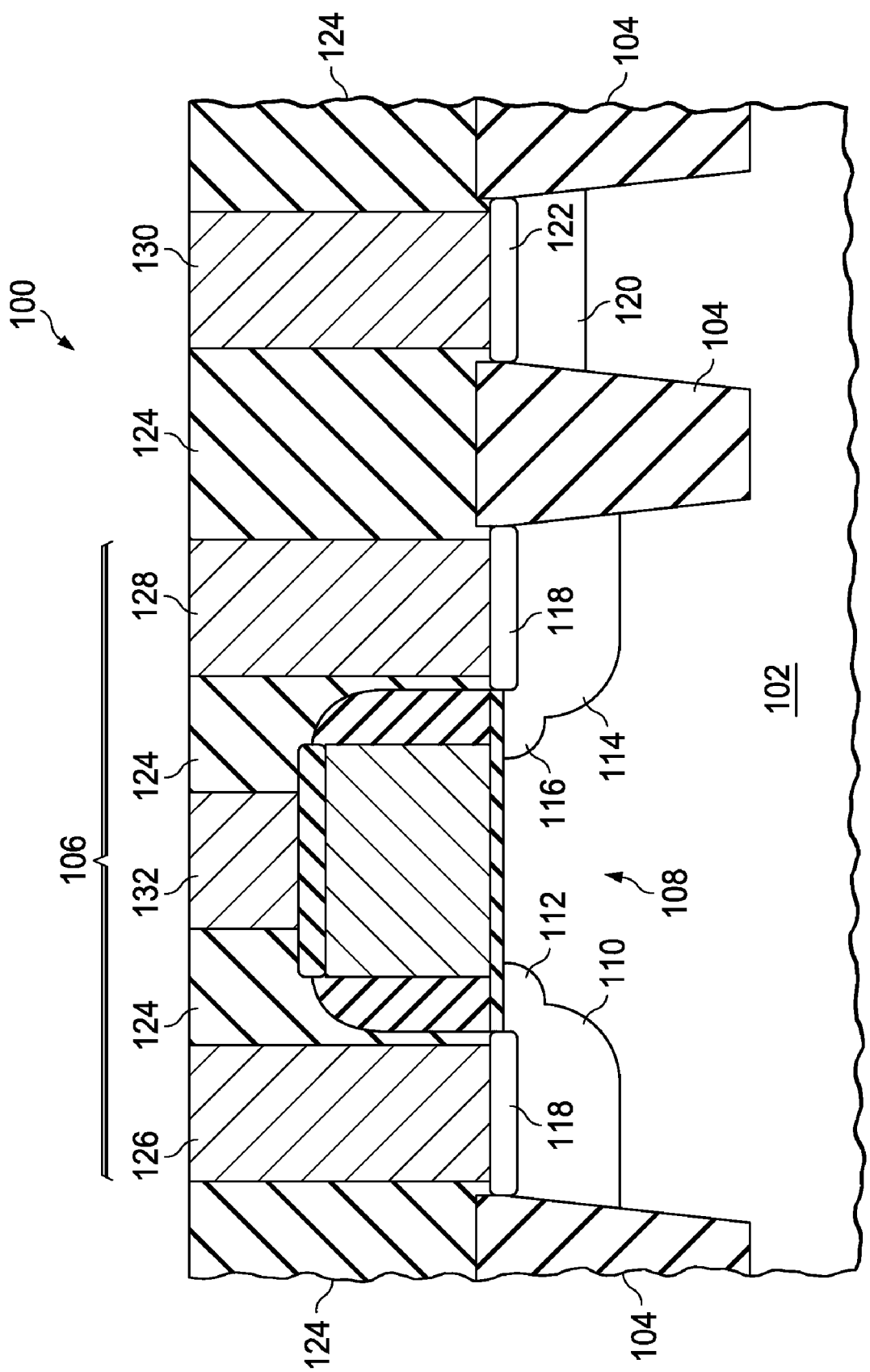
FIG. 1 is a cross-section of a MOS transistor, fabricated on an integrated circuit containing MOS transistors, being measured according to a first embodiment of the instant invention.
Figure 2:
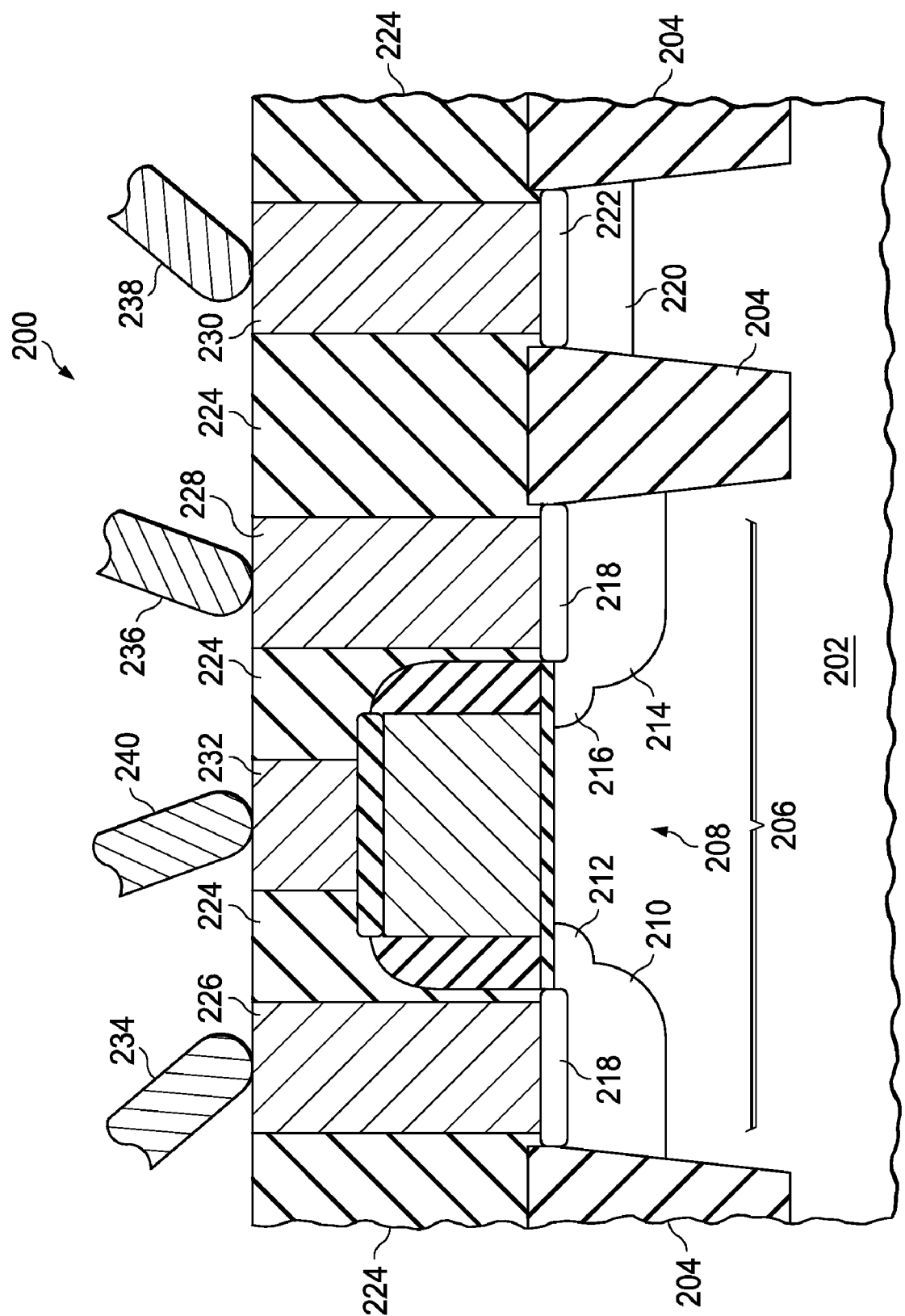
FIG. 2 is a cross-section of a MOS transistor, fabricated on an integrated circuit containing MOS transistors, contacted by probe tips being measured according to a second embodiment the instant invention.

FIG. 1 is a cross-section of a MOS transistor, fabricated on an integrated circuit containing MOS transistors, being measured per this invention. Integrated circuit (100) comprises substrate (102), isolation structures (104), typically formed by local oxidation of silicon (LOCOS) or shallow trench isolation (STI) process, and typically composed of silicon dioxide, and transistor (106). Transistor (106) is further comprised of gate structure (108), source (110), source extension (112), drain (114) and drain extension (116). Source and drain regions may have metal silicide (118) on top surfaces to reduce resistance. The substrate region (102) is contacted through an optional diffused layer (120) and optional metal silicide layer (122). A layer or layers of dielectric material or materials (124), known as the pre-metal dielectric (PMD), is deposited over the transistors and exposed substrate regions. Metal contacts are formed through the PMD to contact regions of interest on the integrated circuit. The transistor source region is contacted by a source contact via (126) and the transistor drain region is contacted by a drain contact via (128). Similarly, the substrate is contacted by a substrate contact via (130), and the gate structure is contacted by a gate contact via (132). The series resistance of the MOS transistor (106) includes the resistance of the source and drain contact vias (126, 128), the source and drain silicide regions (118) if present, source and drain regions (110, 114) and source and drain extensions (112, 116). Transistor (106) may be connected to a measuring apparatus by various means, including, but not limited to, interconnects in the integrated circuit (100) connecting the contact vias (126, 128, 130, 132) to exposed metal regions on a top surface of the integrated circuit (100), which are contacted by probed tips connected to the measuring apparatus, interconnects in the integrated circuit (100) connecting the contact vias (126, 128, 130, 132) to exposed metal regions on a top surface of the integrated circuit (100), which are connect by metal wires to the measuring apparatus, or other means. The source node or drain node has a DC resistance formed by a diode in series with an ohmic impedance that may be estimated from the following expression for the voltage drop, V, across the node as a function of the current flowing through the node, I:

$$V = \frac{nkT}{q}\ln\left(1 + \frac{I}{I_{sat}}\right) + I \cdot R_{S/D}$$

where:
- n is the ideality factor of the diode,
- k is Boltzmann's constant, equal to $1.38 \cdot 10^{-23}$ J/° K
- T is temperature in ° K
- q is the absolute value of the charge on an electron, equal to $1.60 \cdot 10^{-19}$ coulomb
- ln is the natural logarithm function
- $I_{sat}$ is a characteristic current of the diode
- $R_{S/D}$ is the ohmic impedance of the source or drain node FIG. 2 is a cross-section of a MOS transistor, fabricated on an integrated circuit containing MOS transistors, contacted by probe tips being measured per this invention. A situation depicted in FIG. 2 may occur when transistors are probed during fabrication of integrated circuits, or when integrated circuits are deprocessed to expose contact vias for electrical testing. Integrated circuit (200) comprises substrate (202), isolation structures (204), typically formed by local oxidation of silicon (LOCOS) or shallow trench isolation (STI) process, and typically composed of silicon dioxide, and transistor (206). Transistor (206) is further comprised of gate structure (208), source (210), source extension (212), drain (214) and drain extension (216). Source and drain regions may have metal silicide (218) on top surfaces to reduce resistance. The substrate region (202) is contacted through an optional diffused layer (220) and optional metal silicide layer (222). A layer or layers of dielectric material or materials (224), known as the pre-metal dielectric (PMD), is deposited over the transistors and exposed substrate regions. Metal contacts are formed through the PMD to contact regions of interest on the integrated circuit. The transistor source region is contacted by a source contact via (226) and the transistor drain region is contacted by a drain contact via (228). Similarly, the substrate is contacted by a substrate contact via (230), and the gate structure is contacted by a gate contact via (232). Source contact via (226) is contacted by source probe tip (234). Similarly, drain contact via (228) is contacted by drain probe tip (236), substrate contact via (230) is contacted by source probe tip (238) and gate contact via (232) is contacted by gate probe tip (240). In this configuration, probe tips (234, 236, 238, 240) are connected to a measuring apparatus. Resistances between source and drain probe tips (234, 236) and source and drain contact vias (226, 228) may be significant fractions of transistor series resistance, and must be measured accurately to estimate important transistor parameters such as threshold.

Figure 3A:
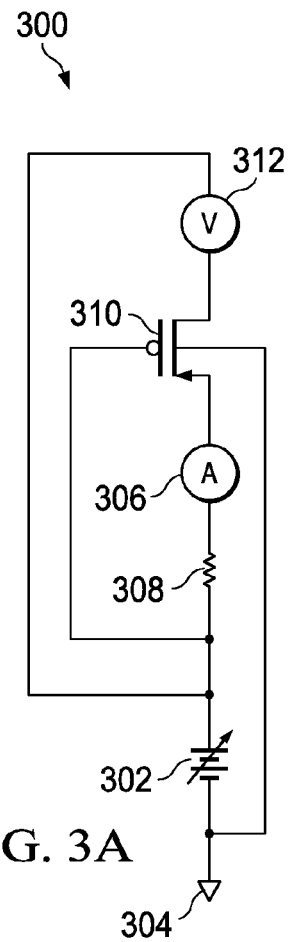
FIG. 3 is a schematic of the measurement circuit used by embodiments of the instant invention, with a MOS transistor under measurement.
Figure 3B:
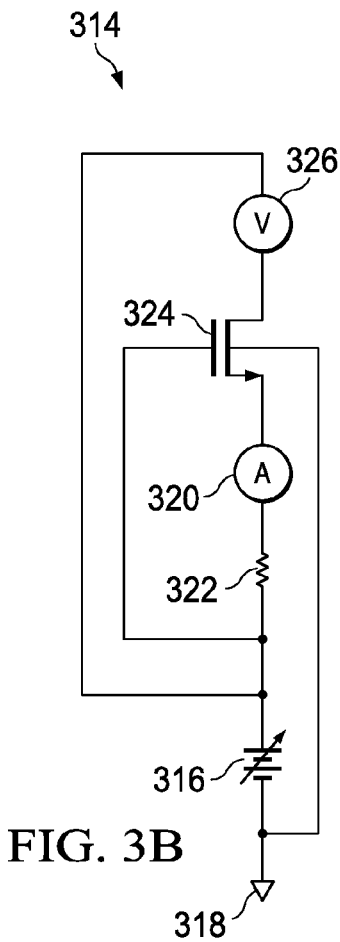

FIG. 3 is a schematic of the measurement circuit used by this invention, with MOS transistors under measurement. FIG. 3A depicts a p-channel MOS transistor being tested. FIG. 3B depicts an n-channel MOS transistor being tested.

Referring to FIG. 3A, a circuit (300) for measuring series resistance in a p-channel MOS transistor comprises an adjustable power supply (302) referenced to a ground node (304), connected through a current meter (306) to an external bias resistor (308), which is connected to a source node of a p-channel MOS transistor (310) being tested. A potentiometer (312) is connected to a drain node of the p-channel MOS transistor (310) being tested and to the node between the external bias resistor (308) and the current meter (306). A gate node of the p-channel MOS transistor (310) is connected to the node between the external bias resistor (308) and the current meter (306). A substrate node of the p-channel MOS transistor (310) is connected to the ground potential node (304). The adjustable power supply (302) is configured to provide a positive potential to the test circuit, referenced to ground, thus forward biasing the source-substrate junction in the p-channel MOS transistor (310). Furthermore, the gate node of the p-channel MOS transistor (310) is biased positive relative to the substrate node, thus forming an accumulation layer under a gate in the p-channel MOS transistor (310). In some embodiments, the external resistor may be eliminated. In some embodiments, the current meter may be integral to the power supply. In some embodiments, the power supply may be replaced with an adjustable current source. In some embodiments, the potentiometer may be connected to the node connecting the external resistor and the MOSFET source, instead of the node connecting the external resistor to the current meter.

Referring to FIG. 3B, a circuit (314) for measuring series resistance in an n-channel MOS transistor comprises an adjustable power supply (316) referenced to a ground node (318), connected through a current meter (320) to an external bias resistor (322), which is connected to a source node of an n-channel MOS transistor (324) being tested. A potentiometer (326) is connected to a drain node of the n-channel MOS transistor (324) being tested and to the node between the external bias resistor (322) and the current meter (320). A gate node of the n-channel MOS transistor (324) is connected to the node between the external bias resistor (322) and the current meter (320). A substrate node of the n-channel MOS transistor (324) is connected to the ground potential node (318). The adjustable power supply (316) is configured to provide a negative potential to the test circuit, referenced to ground, thus forward biasing the source-substrate junction in the n-channel MOS transistor (324). Furthermore, the gate node of the n-channel MOS transistor (324) is biased negative relative to the substrate node, thus forming an accumulation layer under a gate in the n-channel MOS transistor (324). In some embodiments, the external resistor may be eliminated. In some embodiments, the current meter may be integral to the power supply. In some embodiments, the power supply may be replaced with an adjustable current source. In some embodiments, the potentiometer may be connected to the node connecting the external resistor and the MOSFET source, instead of the node connecting the external resistor to the current meter.

Figure 4:
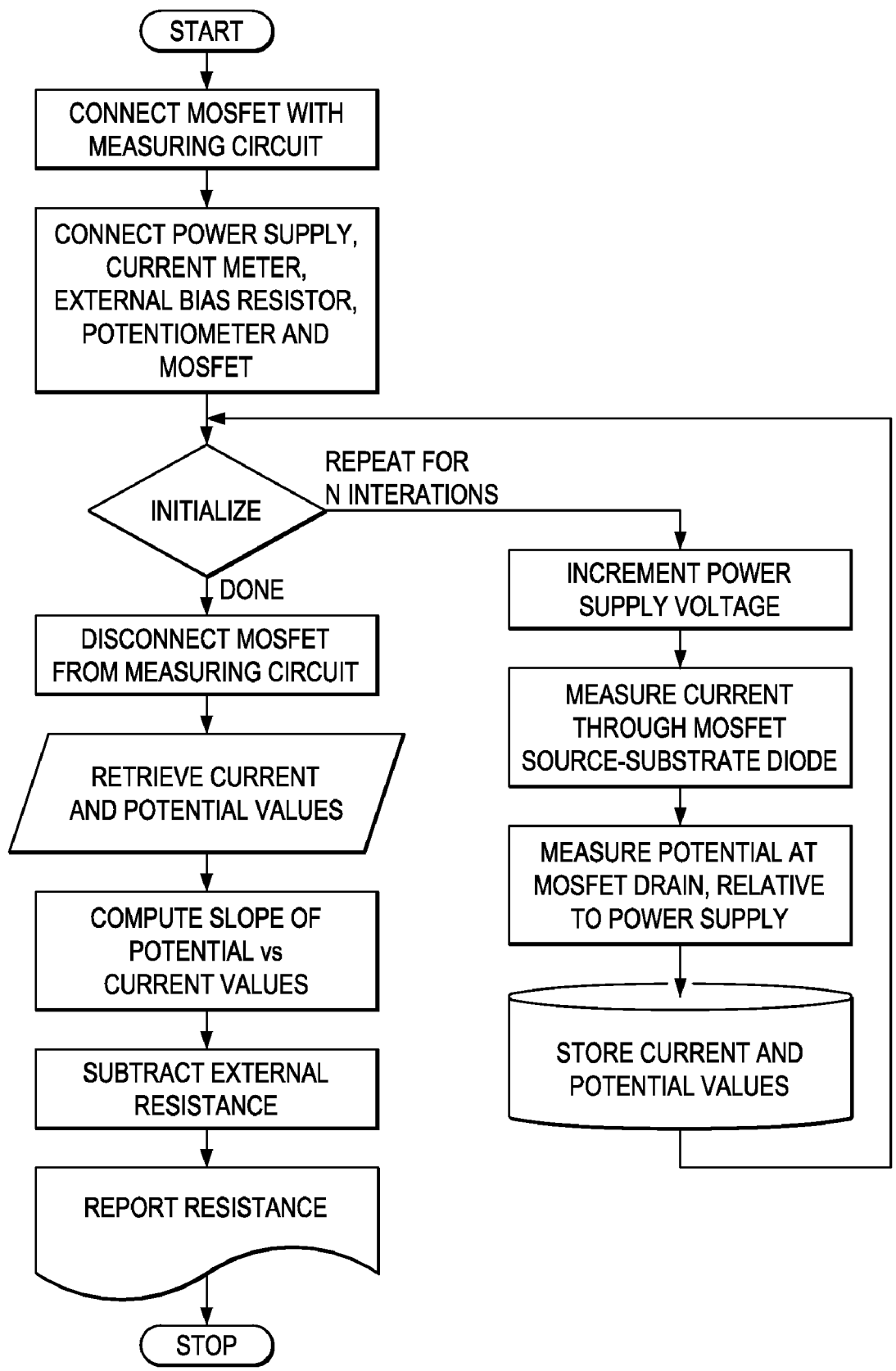
FIG. 4 is a flowchart of the process embodying the instant invention.

FIG. 4 is a flowchart of the process embodying this invention. A MOS transistor to be tested, denoted as MOSFET in FIG. 4, is tested per this invention by the following steps:

1. "Connect MOSFET with measuring circuit"—connect a MOSFET to a measuring circuit as described in FIG. 3. The MOSFET may be connected to the measuring circuit by various means, including, but not limited to, contact with probe tips or insertion into a test socket. In some embodiments, other tests not directly associated with measuring series resistance may be performed before proceeding with the next step.
2. "Connect power supply, current meter, external bias resistor, potentiometer and MOSFET"—This step comprises the following sub-steps:
   a. Connect a substrate node of the MOSFET to the ground node of the test circuit.
   b. Adjust an output node of a power supply in the measuring circuit to zero volts output
   c. Connect a reference node of the power supply in the measuring circuit to the ground node.
   d. Connect the output node of the power supply to a first node of a current meter in the measuring circuit.

e. Connect a second node of the current meter to a first node of an external resistor, if used, in the measuring circuit. If an external resistor is not used, connect a second node of the current meter to a source node of the MOSFET.

f. Connect a second node of the external resistor, if used, to a source node of the MOSFET.

g. Connect a gate node of the MOSFET to the second node of the current meter.

h. Connect a first node of the potentiometer in the measuring circuit to the second node of the current meter.

i. Connect a second node of the potentiometer to a drain node of the MOSFET.

3. "Initialize; Repeat for N interations; Done"—This step includes setting the adjustable power supply to an initial voltage level, then repeating the following steps for a fixed number of iterations or iterating the following steps until a termination criterion is met:

a. "Increment power supply voltage"—increase the magnitude of the voltage output of the power supply by a fixed increment or by a conditional value based on user inputs.

b. "Measure current through MOSFET source-substrate diode"—read an electrical current value from the current meter of the current through the two nodes of the current meter. Retain the current value reading for storage in a subsequent step.

c. "Measure potential at MOSFET drain, relative to power supply"—read a potential difference value from the potentiometer of the potential difference between the drain node of the MOSET and the second node of the current meter. Retain the potential difference value reading for storage in a subsequent step.

d. "Store current and potential values"—store the current value reading and the potential difference value reading for use in a subsequent step.

4. "Disconnect MOSFET from measuring circuit"—in some embodiments, the MOSFET may be disconnected after taking measurements needed for estimating series resistance. In other embodiments, the MOSFET may remain connected to run other tests.

5. "Retrieve current and potential values"—recall the values of current and potential difference that were stored in step 3d above.

6. "Compute slope of potential vs current values"—compute the slope of the data values from step 5 above, using the current values as independent variable values and the potential difference values as dependent variable values. The slope may be computed by various methods, including, but not limited to, least squares, spline curve fitting, visual estimation, or finite difference methodology. The output of this step is a number with units of ohms.

7. "Subtract external resistance"—subtract the value of the external resistor (in ohms) from the computed slope of potential vs current values from step 6. The output of this step is a number with units of ohms.

8. "Report resistance"—report the value obtained from step 7 above to a user, a database, a report, and/or any other record of choice. In some embodiments, this step may be omitted.

The slope may be estimated using a least squares method by the following equation:

$$\text{slope} = \frac{\left(N_{pts} \cdot \sum_{i=1}^{N_{pts}} x_i \cdot y_i\right) - \left(\sum_{i=1}^{N_{pts}} x_i\right) \cdot \left(\sum_{i=1}^{N_{pts}} y_i\right)}{\left(N_{pts} \cdot \sum_{i=1}^{N_{pts}} x_i^2\right) - \left(\sum_{i=1}^{N_{pts}} x_i\right)^2}$$

where:
$N_{pts}$ is the number of data points used to estimate the slope,
$x_i$ is a current value, and
$y_i$ is a potential difference value.

The method described above is advantageous because it allows estimation of series resistance of source and drain nodes of MOSFETs without requiring Kelvin connections or measurements of other test structures. Further, this method is advantageous because it can estimate the series resistance of connections to the MOSET, including probes contacting interconnect to the MOSFET, as might be encountered during testing of partially processed or deprocessed MOSFETs.

Figure 5:
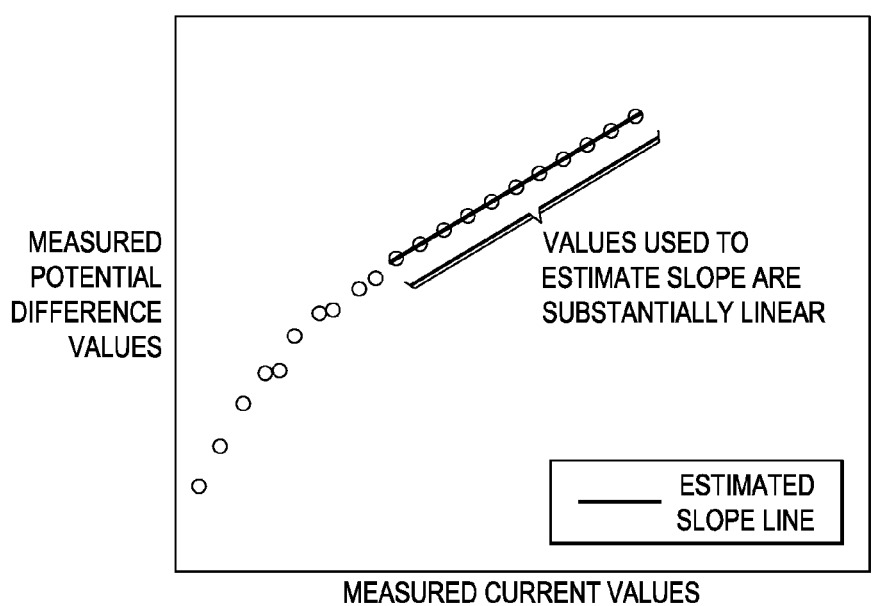
FIG. 5 is chart of potential difference values and current values.

FIG. 5 depicts current and potential difference values plotted in a way to facilitate estimation of a slope for the purpose of computing resistance of a source node of a MOSFET. The values used for estimating the slope are substantially linear, as noted in FIG. 5.

What is claimed is:

1. A method of estimating the source or drain series resistance of a MOS transistor comprising the steps of:
   providing an MOS transistor, comprising:
      a substrate node,
      a source node,
      a drain node, and
      a gate node;
   applying a voltage to said gate node relative to said substrate node to bias the MOS transistor into accumulation;
   applying a current to said source node;
   measuring a potential difference between said source node and said drain node;
   incrementing said current applied to said source node;
   repeating the last two steps for a plurality of iterations to obtain a plurality of current and potential difference values;
   estimating a slope of said current and potential difference values, using a subset of said current values and said potential difference values, wherein said current values are used as independent variable values and said potential difference values are used as dependent variable values, and wherein current values and potential difference values in said subset are substantially linear; and
   assigning said slope to a value of resistance for said source node.

2. The method of claim 1, wherein said current to said source node is provided by an adjustable power supply.

3. The method of claim 1, wherein said current to said source node is provided by an adjustable current source.

4. The method of claim 1, in which the number of said iterations is a fixed number.

5. The method of claim 1, in which said iterations are terminated contingent on a termination criterion applied to said values of current and potential difference readings.

6. The method of claim 1, in which said slope is computed from a subset of said current and potential difference values.

7. The method of claim 1, in which said slope is computed using a least squares algorithm.

8. The method of claim 1, in which said slope is computed from a visual examination of charted values of said current and potential differences.

9. The method of claim 1, in which said MOS transistor is in a process of being fabricated.

10. The method of claim 1, in which said MOS transistor has been completely fabricated and partially deprocessed.

11. The method of claim 1, in which said MOS transistor is part of an integrated circuit.

12. The method of claim 1, further comprising the steps of:
providing an external resistor in series with said source node; and
subtracting the impedance of the external resistor from said slope before assigning a value of resistance for said source node.

13. The methods of any of claim 1, in which connections to said source and drain nodes of said MOS transistor are exchanged.

* * * * *